(12) United States Patent
Slaughter et al.

(10) Patent No.: US 6,205,052 B1
(45) Date of Patent: Mar. 20, 2001

(54) MAGNETIC ELEMENT WITH IMPROVED FIELD RESPONSE AND FABRICATING METHOD THEREOF

(75) Inventors: Jon Slaughter, Tempe, AZ (US); Jing Shi, Salt Lake City, UT (US); Eugene Chen, Gilbert; Saied Tehrani, Tempe, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/422,447

(22) Filed: Oct. 21, 1999

(51) Int. Cl.$^7$ .................................................. G11C 11/15
(52) U.S. Cl. ......................... 365/173; 365/171; 365/158
(58) Field of Search .................................... 365/173, 171, 365/158

(56) References Cited

U.S. PATENT DOCUMENTS

| | | | |
|---|---|---|---|
| 5,173,873 | * 12/1992 | Wu et al. ............................... | 365/173 |
| 5,329,486 | * 7/1994 | Lage ...................................... | 365/145 |
| 5,640,343 | * 6/1997 | Gallagher et al. .................... | 365/171 |
| 5,764,567 | * 12/1992 | Parkin .................................. | 365/173 |
| 5,768,181 | * 6/1998 | Zhu et al. ............................. | 365/158 |
| 5,940,319 | * 8/1999 | Durlam et al. ....................... | 365/171 |

* cited by examiner

Primary Examiner—Vu A. Le
Assistant Examiner—Tuan T. Nguyen
(74) Attorney, Agent, or Firm—William E. Koch

(57) ABSTRACT

An improved and novel device and fabrication method for a magnetic element, and more particularly a magnetic element (10) including a first electrode (14), a second electrode (18) and a spacer layer (16). The first electrode (14) includes a fixed ferromagnetic layer (26). A second electrode (18) is included and comprises a free ferromagnetic layer (28). A spacer layer (16) is located between the fixed ferromagnetic layer (26) and the free ferromagnetic (28) layer, the spacer layer (16). At least one additional layer (20 & 22) is provided between the base metal layer (13) and the spacer layer (16). The base metal layer (13) or at least one of the layers positioned between the base metal layer (13) and the spacer layer (16) having an x-ray amorphous structure such that a reduced topological coupling strength between the free ferromagnetic layer (28) and the fixed ferromagnetic layer (26) is achieved.

19 Claims, 1 Drawing Sheet

MAGNETIC ELEMENT WITH IMPROVED FIELD RESPONSE AND FABRICATING METHOD THEREOF

FIELD OF THE INVENTION

The present invention relates to magnetic elements for information storage and/or sensing and a fabricating method thereof, and more particularly, to a method of fabricating and thus defining the magnetic element to improve magnetic field response.

BACKGROUND OF THE INVENTION

This application is related to a co-pending application that bears Motorola docket number CR 99-001, and U.S. Ser. No. 09/356,864, entitled "MAGNETIC ELEMENT WITH IMPROVED FIELD RESPONSE AND FABRICATING METHOD THEREOF", filed on Jul. 19, 1999, assigned to the same assignee and incorporated herein by this reference, issued U.S. Pat. No. 5,940,319, entitled "MAGNETIC RANDOM ACCESS MEMORY AND FABRICATING METHOD THEREOF," filed on Aug. 31, 1998, assigned to the same assignee and incorporated herein by this reference, co-pending application that bears Motorola docket number CR 97-158 and U.S. Ser. No. 08/986,764, entitled "PROCESS OF PATTERNING MAGNETIC FILMS" filed on Dec. 8, 1997, assigned to the same assignee and incorporated herein by this reference and issued U.S. Pat. No. 5,768,181, entitled "MAGNETIC DEVICE HAVING MULTI-LAYER WITH INSULATING AND CONDUCTIVE LAYERS", issued Jun. 16, 1998, assigned to the same assignee and incorporated herein by this reference.

Typically, a magnetic element, such as a magnetic memory element, has a structure that includes ferromagnetic layers separated by a non-magnetic layer. Information is stored as directions of magnetization vectors in the magnetic layers. Magnetic vectors in one magnetic layer, for instance, are magnetically fixed or pinned, while the magnetization direction of the other magnetic layer is free to switch between the same and opposite directions that are called "parallel" and "antiparallel" states, respectively. In response to parallel and antiparallel states, the magnetic memory element represents two different resistances. The resistance has minimum and maximum values when the magnetization vectors of the two magnetic layers point in substantially the same and opposite directions, respectively. Accordingly, a detection of change in resistance allows a device, such as an MRAM device, to provide information stored in the magnetic memory element. The difference between the minimum and maximum resistance values, divided by the minimum resistance is known as the magnetoresistance ratio (MR).

An MRAM device integrates magnetic elements, more particularly magnetic memory elements, and other circuits, for example, a control circuit for magnetic memory elements, comparators for detecting states in a magnetic memory element, input/output circuits, etc. These circuits are fabricated in the process of CMOS (complementary metal-oxide semiconductor) technology in order to lower the power consumption of the device.

In addition, magnetic elements structurally include very thin layers, some of which are tens of angstroms thick. The performance of the magnetic element is sensitive to the surface conditions on which the magnetic layers are deposited. Accordingly, it is necessary to make a flat surface to prevent the characteristics of a magnetic element from degrading.

During typical magnetic element fabrication, such as MRAM element fabrication, which includes metal films grown by sputter deposition, evaporation, or epitaxy techniques, the film surfaces are not absolutely flat but instead exhibit surface or interface roughness. This roughness of the surfaces and/or interfaces of the ferromagnetic layers is the cause of magnetic coupling between the free ferromagnetic layer and the other ferromagnetic layers, such as the fixed layer or pinned layer, which is known as topological coupling or Néel's orange peel coupling. Such coupling is typically undesirable in magnetic elements because it creates an offset in the response of the free layer to an external magnetic field.

A magnetic structure is known as bottom pinned when the fixed layer is formed before the spacer layer, and the free layer is formed after the spacer layer. In such a bottom-pinned structure the antiferromagnetic (AF) pinning layer is contained in the bottom magnetic electrode. Conventional bottom-pinned magnetic tunnel junctions (MTJ) and spin valve structures use seed and template layers to produce an oriented, crystalline AF layer for strong pinning. The bottom electrode of a typical bottom-pinned MTJ structure includes stacked layers of Ta/NiFe/FeMn/NiFe, which is followed by the $AlO_x$ tunnel barrier, and a top electrode that includes a free layer of NiFe, where the Ta/NiFe seed/template layers induce growth of a highly oriented FeMn(111) layer. This highly oriented FeMn layer provides for strong pinning of the NiFe layer below the $AlO_x$ tunnel barrier. The FeMn layer, or other oriented polycrystalline AF layer produces roughness which causes an increase in undesirable Néel coupling between the pinned NiFe layer and the top free NiFe layer.

In practical MTJ elements the bottom electrode is formed upon a base metal layer which provides a low resistance contact to the junction. The base metal layer is typically polycrystalline and produces roughness which propagates into the bottom electrode and produces roughness at the spacer layer interfaces resulting in an increase in undesirable Néel coupling between the pinned NiFe layer and the top free NiFe layer. The roughness propagated from the base metal layer and the bottom electrode is additionally disadvantageous because it limits the minimum tunnel barrier thickness that can be achieved while retaining high MR and device resistance that scales inversely with junction area.

The topological coupling strength, or Néel coupling, is proportional to surface magnetic charge density and varies as the inverse of an exponential of the interlayer thickness. As disclosed in U.S. Pat. No. 5,764,567, issued Jun. 9, 1998, and entitled "MAGNETIC TUNNEL JUNCTION DEVICE WITH NONFERROMAGNETIC INTERFACE LAYER FOR IMPROVED MAGNETIC FIELD RESPONSE", by adding a non-magnetic copper layer next to the aluminum oxide tunnel barrier in a magnetic tunnel junction structure, hence increasing the separation between the magnetic layers, reduced ferromagnetic orange peel coupling, or topological coupling, is achieved. However, the addition of the copper layer will lower the MR of the tunnel junction, and thus degrade device performance. In addition, the inclusion of the copper layer will increase the complexity for etching the material.

Accordingly, it is a purpose of the present invention to provide an improved magnetic element with improved field response whereby a reduction in Néel coupling is achieved, thereby resulting in improved switching characteristics for MRAM bits and more ideal response in sensor applications.

It is another purpose of the present invention to provide an improved magnetic element that includes reduced ferromagnetic coupling, more particularly ferromagnetic coupling of topological origin.

It is still another purpose of the present invention to provide an improved magnetic element that includes a flatter tunneling barrier, thus lower tunneling barrier thickness and enabling lower resistance.

It is a still further purpose of the present invention to provide a method of forming a magnetic element with improved field response.

It is still a further purpose of the present invention to provide a method of forming a magnetic element with improved field response that is amenable to high throughput manufacturing.

SUMMARY OF THE INVENTION

These needs and others are substantially met through provision of a magnetic element including a base metal layer, a first electrode, a second electrode and a spacer layer. The base metal layer is positioned on an uppermost surface of a substrate element. One of the two electrodes includes a fixed ferromagnetic layer whose magnetization remains fixed in a preferred direction in the presence of an applied magnetic field that is large enough to switch the free layer, and the other electrode includes a free ferromagnetic layer whose magnetization is free to rotate or switch between magnetization states in the presence of an applied magnetic field. A spacer layer is located between the fixed ferromagnetic layer and the free ferromagnetic layer for permitting tunneling current in a direction generally perpendicular to the fixed and free ferromagnetic layers. During fabrication, at least one of the layers formed between the base metal layer and the spacer layer is x-ray amorphous in structure, more specifically of a structure that with ordinary x-ray techniques would show no peaks which would indicate crystallinity, or the base metal layer is itself formed with an amorphous structure. This at least one layer including an x-ray amorphous structure changes the amplitude and/or characteristic length scale of the roughness of the layers deposited upon it to reduce the formation of magnetic poles at the interface with the spacer layer. A decrease in the roughness amplitude, and/or a shift in the predominant length scale of the roughness to lower spatial frequencies, results in a flatter surface and lower topological coupling. Additionally disclosed is a method of fabricating the magnetic element with improved field response.

DETAILED DESCRIPTION OF THE PREFERRED EMBODIMENTS

During the course of this description, like numbers are used to identify like elements according to the different figures that illustrate the invention. As disclosed herein, there are a plurality of ways in which an x-ray amorphous structure can be formed within the magnetic element of the present invention, thereby reducing the formation of magnetic poles at the interface with the spacer layer. More particularly, it is disclosed that in all embodiments an x-ray amorphous structure is formed between a base metal layer (discussed presently) and a spacer layer (discussed presently) or the base metal layer is itself formed with an amorphous structure. Generally, this is achieved by creating an x-ray amorphous antiferromagnetic pinning layer (discussed presently) by including an amorphous seed layer, or a combined amorphous seed and template layer, or by actually making one of the ferromagnetic layers amorphous, or by making the base metal layer amorphous.

Figure 1:
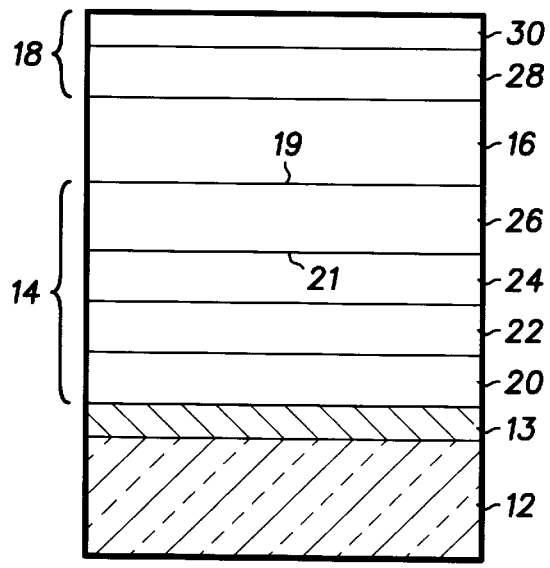
FIG. 1 illustrates a cross-sectional view of a first embodiment of a magnetic element with improved field response according to the present invention.

Accordingly, illustrated in FIGS. 1–4 are various embodiments implementing an x-ray amorphous layer so as to provide for reduced Néel coupling in a layered magnetic element. More particularly, FIG. 1 illustrates in cross-sectional view a first embodiment of a magnetic element according to the present invention. Illustrated in FIG.1, is a fully patterned magnetic element structure 10. The structure includes a substrate 12, a first electrode multilayer stack 14, a spacer layer 16 including oxidized aluminum, and a second electrode multilayer stack 18. It should be understood that spacer layer 16 is formed dependent upon the type of magnetic element being fabricated. More particularly, in a MTJ structure, spacer layer 16 is formed of a dielectric material, and in a spin valve structure, spacer layer 16 is formed of a conductive material. First electrode multilayer stack 14 and second electrode multilayer stack 18 include ferromagnetic layers. First electrode layers 14 are formed on a base metal layer 13, which is formed on substrate 12. Base metal layer 13 is disclosed as composed of a single metal material or layer or a stack of more than one metal material or layer. First electrode layers 14 include a first seed layer 20, deposited on base metal layer 13, a template layer 22, a layer of antiferromagnetic pinning material 24, and a fixed ferromagnetic layer 26 formed on and exchange coupled with the underlying antiferromagnetic pinning layer 24. In this first embodiment, seed layer 20 is described as being x-ray amorphous in structure. Typically, seed layer 20 is formed of tantalum nitride (TaNx) having template layer 22 formed thereon. Template layer 22 in this particular embodiment is formed of ruthenium (Ru). This combination of seed layer 20 and template layer 22 provides for the formation of an x-ray amorphous pinning layer 24, typically formed of iron manganese (FeMn).

Ferromagnetic layer 26 is described as fixed, or pinned, in that its magnetic moment is prevented from rotation in the presence of an applied magnetic field. Ferromagnetic layer 26 is typically formed of alloys of one or more of the following: nickel (Ni), iron (Fe), and cobalt (Co) and includes a top surface 19 and a bottom surface 21.

Second electrode stack 18 includes a free ferromagnetic layer 28 and a protective contact layer 30. The magnetic moment of the free ferromagnetic layer 28 is not fixed, or pinned, by exchange coupling, and is free to rotate in the presence of an applied magnetic field. Free ferromagnetic layer 28 is typically formed of a nickel iron (NiFe) alloy or a nickel iron cobalt (NiFeCo) alloy. It should be understood that a reversed, or flipped, structure is anticipated by this disclosure. More particularly, it is anticipated that the disclosed magnetic element can be formed to include a top fixed, or pinned, layer, and thus described as a top pinned structure.

As previously discussed, in this particular embodiment seed layer 20 is formed having an x-ray amorphous structure, more particularly seed layer 20 is formed absent any formation of crystalline structures. This absence of a crystalline structure provides for a flatter, or smoother interface with template layer 22, and thus pinning layer 24, and thus an overall decrease in Néel coupling. In the particular embodiment where template layer 22 is formed of Ru and pinning layer 24 is formed of FeMn, a thin layer of Ru grows on the x-ray amorphous seed layer 20 having a randomly oriented polycrystalline structure, which causes the FeMn to also be x-ray amorphous. This absence of a crystalline structure in the pinning layer 24 provides for a flatter, or smoother fixed layer 26, so that both interfaces 19 and 21 are flatter than they would be with conventional polycrystalline layers in the first electrode. The resulting decrease in Néel coupling provides for a device, such as a MRAM device, having better switching characteristics for MRAM bits, and provides for a more ideal response in sensor applications.

Figure 2:
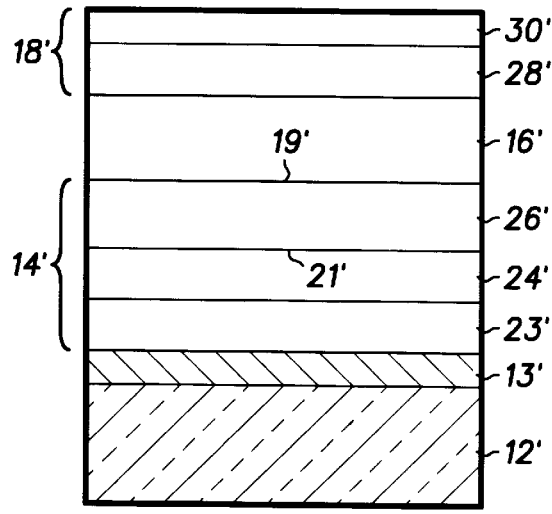
FIG. 2 illustrates a cross-sectional view of an alternative embodiment of a magnetic element with improved field response according to the present invention.

Referring now to FIG. 2, illustrated is an alternative embodiment of the magnetic element of the present invention, similar to the element of FIG. 1. It should be noted that all components similar to the components illustrated in FIG. 1, are designated with similar numbers, having a prime added to indicate the different embodiment.

FIG. 2 illustrates in cross-sectional view, a second embodiment of a magnetic element according to the present invention. More particularly, illustrated in FIG.2, is a fully patterned magnetic element structure 10'. The structure includes a substrate 12', a first electrode multilayer stack 14', a spacer layer 16' including oxidized aluminum, and a second electrode multilayer stack 18'. First electrode multilayer stack 14' and second electrode multilayer stack 18' include ferromagnetic layers. First electrode layers 14' are formed on a base metal layer 13', which is formed on substrate 12'. First electrode layers 14' include a layer 23, which serves as a combination seed layer and template layer, deposited on base metal layer 13', a layer of antiferromagnetic pinning material 24', and a fixed ferromagnetic layer 26' formed on and exchange coupled with the underlying antiferromagnetic pinning layer 24'.

In this second embodiment, layer 23 is described as serving as a combination seed/template layer, more particularly, it takes the place of both the seed and template layers. Typically, combination layer 23 is formed of either tantalum (Ta), ruthenium (Ru) or a compound of tantalum and nitrogen (TaN$_x$). This combination layer 23, used in combination with certain base metal layers such as aluminum (Al), provides for the formation, or seeds the growth, of an x-ray amorphous pinning layer 24', typically formed of iron manganese (FeMn). In an alternative embodiment, it is disclosed that a compound of tantalum and nitrogen is positioned between the base metal layer and the spacer layer, the layer of a compound of tantalum and nitrogen is in this instance formed itself as an amorphous structure, such that reduced topological coupling strength between the free ferromagnetic layer and the fixed ferromagnetic layer is achieved without degradation of the electrical properties of the device.

Similar to the device of FIG. 1, ferromagnetic layer 26' is described as fixed, or pinned, in that its magnetic moment is prevented from rotation in the presence of an applied magnetic field. Ferromagnetic layer 26' is typically formed of alloys of one or more of the following: nickel (Ni), iron (Fe), and cobalt (Co) and includes a top surface 19' and a bottom surface 21'.

Second electrode stack 18' includes a free ferromagnetic layer 28' and a protective contact layer 30'. The magnetic moment of the free ferromagnetic layer 28' is not fixed, or pinned, by exchange coupling, and is free to rotate in the presence of an applied magnetic field. Free ferromagnetic layer 28' is typically formed of a nickel iron (NiFe) alloy or a nickel iron cobalt (NiFeCo) alloy. It should be understood that a reversed, or flipped, structure is anticipated by this disclosure. More particularly, it is anticipated that the disclosed magnetic element can be formed to include a top fixed, or pinned layer, and thus described as a top pinned structure.

In this particular embodiment layer 23 is formed having a randomly oriented polycrystalline structure, which gives rise to an x-ray amorphous structure in pinning layer 24'. This absence of a crystalline structure provides for a flatter or smoother interface 21' on which to grow the fixed layer 26', which in turn produces a flatter or smoother interface 19' and thus an overall decrease in Néel coupling. This decrease in Néel coupling provides for a device with more ideal switching characteristics for MRAM bits, and provides for a more ideal response in sensor applications.

Figure 3:
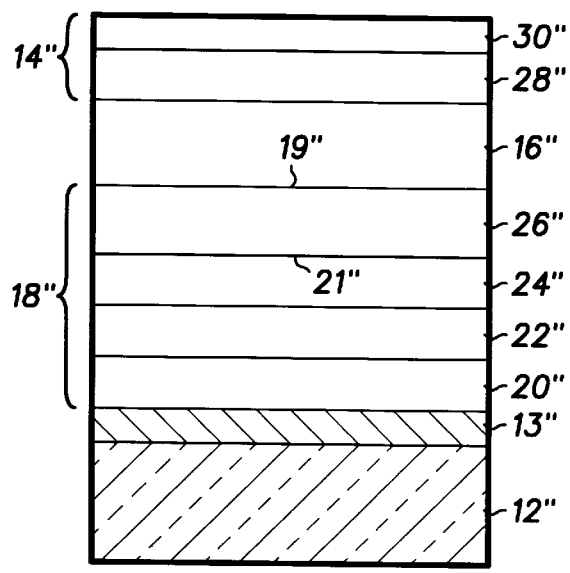
FIG. 3 illustrates a cross-sectional view of a yet another alternative embodiment of a magnetic element with improved field response according to the present invention.

Referring now to FIG. 3, illustrated is an alternative embodiment of the magnetic element of the present invention, similar to the element of FIGS. 1 and 2. It should be noted that all components similar to the components illustrated in FIGS. 1 and 2, are designated with similar numbers, having a double prime added to indicate the different embodiment.

FIG. 3 illustrates in cross-sectional view a third embodiment of a magnetic element according to the present invention. More particularly, illustrated in FIG. 3, is a fully patterned magnetic element structure 10". The structure includes a substrate 12", a first electrode multilayer stack 18", a spacer layer 16" including oxidized aluminum, and a second electrode multilayer stack 14". First electrode multilayer stack 18" and second electrode multilayer stack 14" include ferromagnetic layers. First electrode layers 18" are formed on a base metal layer 13", which is formed on substrate 12". First electrode layers 18" include a first seed layer 20" and a template layer 22" deposited on base metal layer 13", a layer of antiferromagnetic pinning material 24", and a fixed ferromagnetic layer 26" formed on and exchange coupled with the underlying antiferromagnetic pinning layer 24".

Similar to the device of FIGS. 1 and 2, ferromagnetic layer 26" is described as fixed, or pinned, in that its magnetic moment is prevented from rotation in the presence of an applied magnetic field. Ferromagnetic layer 26" is typically formed of alloys of one or more of the following: nickel (Ni), iron (Fe), and cobalt (Co) and includes a top surface 19" and a bottom surface 21".

Second electrode stack 14" includes a free ferromagnetic layer 28" and a protective contact layer 30". The magnetic moment of the free ferromagnetic layer 28" is not fixed, or pinned, by exchange coupling, and is free to rotate in the presence of an applied magnetic field. Free ferromagnetic layer 28" is typically formed of a nickel iron (NiFe) alloy or a nickel iron cobalt (NiFeCo) alloy. It should be understood that a reversed, or flipped, structure, such as that illustrated in FIG. 4, and referenced with all components similar to the components illustrated in FIGS. 1, 2 and 3, designated by a triple prime, is anticipated by this disclosure. More particularly, it is anticipated that the disclosed magnetic element can be formed to include a top fixed, or pinned layer (designated 26'''), and thus described as a top pinned structure.

In this particular embodiment, illustrated in FIG. 3, the fixed ferromagnetic layer 26" is formed having an x-ray amorphous structure, absent any formation of crystalline structures. This absence of a crystalline structure provides a flatter or smoother interface with spacer layer 16" and thus a decrease in Néel coupling. As illustrated, by forming fixed layer 26" so as to include an x-ray amorphous structure, the magnitude of the coupling field $H_{cpl}$ is dramatically reduced.

Figure 4:
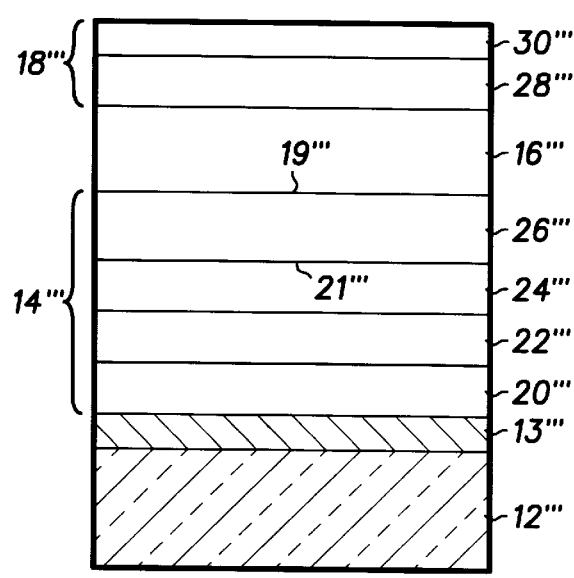
FIG. 4 illustrates a cross-sectional view of a still further embodiment of a magnetic element with improved field response according to the present invention.

For the top-pinned structure illustrated in FIG. 4, one or more of layers 20''', 22''', and 28''' is formed as an x-ray amorphous structure to produce a smoother or flatter interface with the spacer layer 16'''. The smoother or flatter the interface between layers 28''' and 16''' results in smoother or flatter interfaces between the layers which are subsequently formed above it including the interface between 16''' and 26''' which has a major contribution to the Néel coupling across the spacer. These smoother or flatter interfaces result in a decrease in Néel coupling.

In all embodiments, using an x-ray amorphous base metal layer 13", rather than a polycrystalline layer, would result in smoother or flatter interfaces between the layers which are subsequently formed above it, resulting in a decrease in Néel coupling between the fixed and free layer.

In all embodiments, it is understood by those skilled in the art that the fixed layer could be replaced by a three layer stack composed of a pinned magnetic layer directly on the pinning material and a fixed magnetic layer which is strongly antiferromagnetically coupled to the pinned layer through a nonmagnetic layer, such as ruthenium (Ru) or rhodium (Rh), that separates them while providing the strong antiferromagnetic coupling. It is furthermore understood by those skilled in the art that the base metal layer could be composed of a single metal or composed of a stack of more than one metal.

According to this disclosure, what is sought to be achieved is the reduction in the strength of the Néel coupling, also known as topological coupling, by forming a layer having an x-ray amorphous structure. Forming an x-ray amorphous layer subsequent to depositing the base metal and prior to depositing the spacer layer, or forming an x-ray amorphous base metal layer, produces flatter or smoother interfaces between the magnetic electrode layers and the spacer layer. These flatter or smoother interfaces result in a reduction in strength of the Néel coupling, also known as topological coupling, compared to that obtained with conventional crystalline or polycrystalline layers.

In all embodiments, it should be understood by those skilled in the art that the fixed layer can be replaced by a three layer stack, composed of a pinned magnetic layer which is strongly antiferromagnetically coupled to the pinned layer through a nonmagnetic layer, such as ruthenium (Ru) or rhodium (Rh). This layer provides for separation while allowing for strong antiferromagnetic coupling. It is further understood, by those skilled in the art that in some structures the fixed and pinning layers are replaced by a single layer with a coercivity or switching field substantially higher than the free layer.

Thus, a magnetic element with an improved field response and its fabrication method are disclosed in which the magnetic coupling is at near zero based on the roughness of the interface surface of the spacer layer with the remaining metal thin film structure. As disclosed, a layer having an x-ray amorphous structure is provided between the base metal layer and the spacer layer. This technique can be applied to devices using patterned magnetic elements, such as magnetic sensors, magnetic recording heads, magnetic recording media, or the like. Accordingly, such instances are intended to be covered by this disclosure

What is claimed is:

1. A magnetic element comprising:

a base metal layer having an uppermost surface;

a first electrode positioned on the uppermost surface of the base metal layer, the first electrode including a ferromagnetic layer;

a second electrode positioned spaced apart from the first electrode, the second electrode including a ferromagnetic layer;

wherein the ferromagnetic layers of the first electrode and the second electrode include in combination a fixed ferromagnetic layer and a free ferromagnetic layer, the fixed ferromagnetic layer having a magnetization that is fixed in a preferred direction in the presence of an applied magnetic field capable of switching the free layer, and the free ferromagnetic layer having a magnetization that is free to rotate between magnetization states in the presence of an applied magnetic field;

a spacer layer located between the ferromagnetic layer of the first electrode and the ferromagnetic layer of the second electrode;

wherein one of the layers formed below the spacer layer is an x-ray amorphous structure such that reduced topological coupling strength between the free ferromagnetic layer and the fixed ferromagnetic layer is achieved; and a substrate, the base metal layer, the first and second electrodes, and the spacer layer, being formed on the substrate.

2. A magnetic element as claimed in claim 1 further including a layer of ruthenium positioned between the base metal layer and the spacer layer, the layer of ruthenium seeding the growth of an x-ray amorphous structure layer between the base metal layer and the spacer layer, such that reduced topological coupling strength between the free ferromagnetic layer and the fixed ferromagnetic layer is achieved without degradation of the electrical properties of the device.

3. A magnetic element as claimed in claim 2 wherein the layer of ruthenium seeding the growth of an x-ray amorphous structure layer between the base metal layer and the spacer layer forms an x-ray amorphous pinning layer.

4. A magnetic element as claimed in claim 1 further including a layer of tantalum positioned between the base metal layer and the spacer layer, the layer of tantalum seeding the growth of an x-ray amorphous structure layer between the base metal and the spacer layer, such that reduced topological coupling strength between the free ferromagnetic layer and the fixed ferromagnetic layer is achieved without degradation of the electrical properties of the device.

5. A magnetic element as claimed in claim 4 wherein the layer of tantalum seeding the growth of an x-ray amorphous structure layer between the base metal layer and the spacer layer forms an x-ray amorphous pinning layer.

6. A magnetic element as claimed in claim 1 further including a layer of a compound of tantalum and nitrogen positioned between the base metal layer and the spacer layer, the layer of a compound of tantalum and nitrogen formed as an x-ray amorphous structure, such that reduced topological coupling strength between the free ferromagnetic layer and the fixed ferromagnetic layer is achieved without degradation of the electrical properties of the device.

7. A magnetic element as claimed in claim 1 further including a layer of a compound of tantalum and nitrogen positioned between the base metal layer and the spacer layer, the layer of a compound of tantalum and nitrogen seeding the growth of an x-ray amorphous structure layer between the base metal and the spacer layer, such that reduced topological coupling strength between the free ferromagnetic layer and the fixed ferromagnetic layer is achieved without degradation of the electrical properties of the device.

8. A magnetic element as claimed in claim 7 wherein the layer of a compound of tantalum and nitrogen seeding the growth of an x-ray amorphous structure layer between the base metal layer and the spacer layer forms an x-ray amorphous pinning layer.

9. A magnetic element as claimed in claim 1 wherein the first electrode positioned on the uppermost surface of the base metal layer includes the layer having the x-ray amorphous structure.

10. A magnetic element as claimed in claim 1 wherein the free ferromagnetic layer and the fixed ferromagnetic layer include at least one of NiFe, NiFeCo, CoFe, or Co.

11. A magnetic element as claimed in claim 1 wherein the spacer layer includes one of a dielectric material defining a MTJ structure or a conductive material defining a spin valve structure.

12. A magnetic element comprising:

a base metal layer;

a fixed ferromagnetic layer and a spaced apart free ferromagnetic layer positioned adjacent the base metal layer, the fixed ferromagnetic layer including a magnetic moment that is fixed in a preferred direction in the presence of an applied magnetic field capable of switching the free ferromagnetic layer and the free ferromagnetic layer including a magnetic moment that is oriented generally perpendicular to the moment of the fixed layer and is free to rotate away from said perpendicular orientation in the presence of an applied magnetic field; and a spacer layer located between the fixed ferromagnetic layer and the free ferromagnetic layer;

wherein at least one layer formed below the spacer layer has an x-ray amorphous structure to produce reduced topological coupling strength between the free ferromagnetic layer and the fixed ferromagnetic layer.

13. A magnetic element as claimed in claim 12 further including a layer of ruthenium positioned between the base metal layer and the spacer layer, the layer of ruthenium seeding the growth of an x-ray amorphous structure layer between the base metal layer and the spacer layer, such that reduced topological coupling strength between the free ferromagnetic layer and the fixed ferromagnetic layer is achieved without degradation of the electrical properties of the device.

14. A magnetic element as claimed in claim 13 wherein the layer of ruthenium seeding the growth an x-ray amorphous structure layer between the base metal layer and the spacer layer forms an x-ray amorphous pinning layer.

15. A magnetic element as claimed in claim 12 further including a layer of tantalum positioned between the base metal layer and the spacer layer, the layer of tantalum seeding the growth an x-ray amorphous structure layer between the base metal and the spacer layer, such that reduced topological coupling strength between the free ferromagnetic layer and the fixed ferromagnetic layer is achieved without degradation of the electrical properties of the device.

16. A magnetic element as claimed in claim 15 wherein the layer of tantalum seeding the growth of an x-ray amorphous structure layer between the base metal layer and the spacer layer forms an x-ray amorphous pinning layer.

17. A magnetic element as claimed in claim 12 further including a layer of a compound of tantalum and nitrogen positioned between the base metal layer and the spacer layer, the layer of a compound of tantalum and nitrogen formed as an x-ray amorphous structure, such that reduced topological coupling strength between the free ferromagnetic layer and the fixed ferromagnetic layer is achieved without degradation of the electrical properties of the device.

18. A magnetic element as claimed in claim 12 further including a layer of a compound of tantalum and nitrogen positioned between the base metal layer and the spacer layer, the layer of a compound of tantalum and nitrogen seeding the growth an x-ray amorphous structure layer between the base metal and the spacer layer, such that reduced topological coupling strength between the free ferromagnetic layer and the fixed ferromagnetic layer is achieved without degradation of the electrical properties of the device.

19. A magnetic element as claimed in claim 18 wherein the layer of a compound of tantalum and nitrogen seeding the growth of an x-ray amorphous structure layer between the base metal layer and the spacer layer forms an x-ray amorphous pinning layer.

* * * * *

UNITED STATES PATENT AND TRADEMARK OFFICE
CERTIFICATE OF CORRECTION

PATENT NO.     : 6,205,052 B1
DATED          : March 20, 2001
INVENTOR(S)    : Slaughter et al.

It is certified that error appears in the above-identified patent and that said Letters Patent is hereby corrected as shown below:

<u>Column 1,</u>
Line 4, after the Title, please add as a new first paragraph the following paragraph:

-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*